United States Patent [19]

O'Neill

[11] Patent Number: 5,364,743
[45] Date of Patent: Nov. 15, 1994

[54] PROCESS FOR FABRICATION OF BUBBLE JET USING POSITIVE RESIST IMAGE REVERSAL FOR LIFT OFF OF PASSIVATION LAYER

[75] Inventor: James F. O'Neill, Penfield, N.Y.

[73] Assignee: Xerox Corporation, Stamford, Conn.

[21] Appl. No.: 999,332

[22] Filed: Dec. 31, 1992

Related U.S. Application Data

[63] Continuation-in-part of Ser. No. 632,989, Dec. 21, 1990, abandoned.

[51] Int. Cl.$^5$ .................. G03C 5/00; G01D 15/16
[52] U.S. Cl. .................. 430/320; 430/330; 430/324; 430/315; 430/328; 340/76 PH; 29/890.1; 347/63
[58] Field of Search .................. 346/140 R, 76 PH; 29/611, 890.1; 430/326, 328, 315, 324, 830, 320

[56] References Cited

U.S. PATENT DOCUMENTS

| | | | |
|---|---|---|---|
| 4,104,070 | 8/1978 | Moritz et al. | 430/329 |
| 4,659,650 | 4/1987 | Moritz et al. | 430/326 |
| 4,710,263 | 12/1987 | Kato | 346/76 PH |
| 4,947,193 | 8/1990 | Deshpande | 346/140 R |
| 5,045,870 | 9/1991 | Lamey et al. | 346/140 R |
| 5,049,231 | 9/1991 | Shibada | 156/630 |
| 5,063,655 | 11/1991 | Lamey et al. | 346/140 R |
| 5,175,565 | 12/1992 | Ishinaga et al. | 346/140 R |

FOREIGN PATENT DOCUMENTS

63-77027 4/1988 Japan.

Primary Examiner—Charles L. Bowers, Jr.
Assistant Examiner—Martin Angebrandt
Attorney, Agent, or Firm—Kenyon & Kenyon

[57] ABSTRACT

In bubble jet heater dies, a photolithographic process is disclosed to form patterned photoresist structures having re-entrant angles to facilitate an improved lift-off structure for anti-cavitation layer deposition. A substrate is coated with a photoresist which includes 0.5% to 1.0% Monazoline C. When exposed to Ultra-Violet light and developed, apertures in the photoresist have inverted side walls. Anti-cavitation material, such as tantalum, is then sputtered onto the substrate and the photoresist to form patterned metal. structures. The lift-off of the patterned photoresist is easily performed leaving behind the patterned metal structures. The use of this lift-off deposition method prevents stress-cracking in the anti-cavitation layer seen in deposition and etch methods.

10 Claims, 7 Drawing Sheets

PROCESS FOR FABRICATION OF BUBBLE JET USING POSITIVE RESIST IMAGE REVERSAL FOR LIFT OFF OF PASSIVATION LAYER

This application is a continuation-in-part of U.S. patent application Ser. No. 07/632,989, filed on Dec. 21, 1990, now abandoned.

BACKGROUND OF THE INVENTION

The present invention relates to a process for forming patterned metallic anti-cavitation layers in a thermal ink jet heater die using positive resist image reversal.

One of the many uses for patterned thin films is in the fabrication of thermal ink jet heater dies for use in printing devices. A thermal ink jet printhead typically comprises two halves which are joined together. A first half comprises a number of electronic circuits including timing gates and addressable resistors (i.e. heating elements or heaters). The second half comprises an ink reservoir and a number of etched channels. When the first and second halves are joined together, an exclusive, addressable heating element rests within each channel. The heating element, when activated, draws ink from the reservoir through the channel and out of a channel orifice or nozzle. Vapor ink bubbles are formed in the channel during this process. Collapse of these bubbles can cause damage to heating elements within a channel. Accordingly, an anti-cavitation material is used in each channel to prevent such damage.

An anti-cavitation material, such as tantalum, has a number of important properties: high strength and hardness, corrosion resistance, and excellent heat and electric conducting properties. Typically, tantalum structures are formed in the ink channels using a deposition and etch technique. As shown in FIGS. 1a-c, with this process a thin film of tantalum 3 is deposited onto a substrate 1 and coated with photoresist forming a photoresist layer 5. The photoresist layer is then exposed to radiation such as electromagnetic radiation or electron beam radiation. For example, the photoresist layer 5 is exposed to Ultra-Violet (UV) light through a mask 7. The photoresist layer is then developed leaving a patterned photoresist layer 5 on the tantalum layer 3. Depending on the type of substrate being used, the tantalum layer 3 is patterned either by wet etching or plasma etching techniques, which are well known in the art. The substrate 1 is then cleaned, thus removing the photoresist.

In a typical thermal ink jet printhead fabrication process, a silicon wafer will be prepared which contains only the first halves of the printhead having electronic circuitry, as described above. Approximately 100 to 600 of these electronic circuitry halves can be placed on a 4-inch diameter silicon wafer. In using the aforementioned deposition and etch technique, the anti-cavitation layer is blanket coated over the entire wafer and all of these printhead halves.

Blanket coating a wafer with a hard material such as tantalum results in a tantalum film which is highly stressed as deposited. This stress can lead to cracking in the film. Any cracks in the film severely degrade the heat and electric conducting properties of the tantalum layer in those areas. By depositing tantalum in isolated regions only where required, this stress cracking can be avoided, thus improving yields.

Electrical isolation is needed between aluminum conductors coupled to the heating elements and the anti-cavitation layer. To facilitate this, Level 7 silicon nitride is deposited as a layer between the aluminum conductors and the anti-cavitation layer. When an anti-cavitation layer such as tantalum is plasma etched during the patterning step, the nitride layer must be made thicker than desired to compensate for tantalum overetching and any non-uniformity in the etching process.

A number of other methods have been utilized for depositing various metals on semiconductor substrates with variable success and certain limitations. For instance, in U.S. Pat. Nos. 3,982,943 and 4,004,044, inner and outer photoresist layers are formed on a substrate with an intervening polymeric separating layer. The separate developing of the two photoresist layers causes a larger aperture in the inner photoresist layer than the outer photoresist layer, thus forming an overhanging structure. After deposition of a metallic film in these apertures, the photoresist layers are easily removed.

In U.S. Pat. No. 4,104,070, a photoresist is modified by adding Monazoline C. The resulting development of exposed areas in a photoresist layer forms clean and protected areas on a wafer.

In U.S. Pat. No. 4,564,584, a second photoresist layer containing imidazole having a negative exposure quality is coated over a developed first photoresist layer. The entire structure is then exposed to light and the undeveloped areas of the first photoresist layer are developed and removed. What remains is the imidazole photoresist covering the areas that were originally developed in the first photoresist layer.

In U.S. Pat. No. 4,284,706, a photoresist layer comprising a phenolic-aldehyde resin, a naphthoquinone diazide sulfonic acid ester sensitizer, and a profile modifying agent is formed on a substrate. When developed, this photoresist layer will have a negatively sloped aperture which improves the deposition of a metallic film.

In U.S. Pat. No. 3,873,361, an organic polymeric photoresist layer is first formed on a substrate and baked. Then, a metallic layer and a second photoresist layer are formed on the organic photoresist layer. The second photoresist layer is exposed through a mask and developed leaving exposed areas on the metallic layer. The metallic layer is then etched leaving exposed areas of the organic photoresist layer. When removing the exposed organic photoresist layer, the aperture through the organic photoresist layer is larger than the aperture through the second photoresist layer. This facilitates an improved deposition of metallic film.

In U.S. Pat. No. 3,934,057, several photoresist layers are formed on a substrate. Each of the layers has a successively slower dissolving rate in the resist developer. When developed, apertures in these photoresist layers have overhanging edges which are useful in metal deposition and lift-off.

None of these methods address the stress-cracking problems seen in depositing an anti-cavitation layer, such as tantalum, onto a thermal ink jet printhead. Many metals, such as gold, silver, copper, and aluminum do not exhibit stress-cracking problems when blanket deposited onto a substrate. There is a need for a deposition method that places anti-cavitation material in appropriate positions in a thermal ink jet printer die while avoiding stress-cracking.

SUMMARY OF THE INVENTION

The present method of forming patterned anti-cavitation metallic layers on a substrate includes coating a substrate with photoresist to form a photoresist layer, using a photoresist, for example, AZ1375 modified by adding 0.5% to 1.0% Monazoline C. The photoresist layer and substrate are then exposed to electromagnetic radiation, such as Ultra-Violet light, through a mask that includes areas transparent and opaque to the electromagnetic radiation. The substrate and photoresist layer are then baked at approximately 95° C. to 100° C. for a period of time (e.g. ten minutes). After blanket exposing the entire substrate, the photoresist layer is then developed sufficiently to form patterned structures in said photoresist layer. These patterned resist structures have negatively-sloped, inverted side walls. Therefore, the developed photoresist has overhanging structures over discrete areas on the substrate where an anti-cavitation layer is to be formed. An anti-cavitation material, such as tantalum, is sputtered onto the substrate and photoresist layer sufficiently to form a patterned metallic layer. The photoresist layer is then removed, leaving behind the patterned anti-cavitation layer on the substrate. Since the anti-cavitation layer is formed in discrete areas on the substrate rather than over the entire substrate, stress-cracking in this layer is avoided.

The above is a brief description of some deficiencies in disclosed metal lift-off process and advantages of the present invention. Other features, advantages and embodiments of the invention will be apparent to those skilled in the art from the following description, accompanying drawings and appended claims.

BRIEF DESCRIPTION OF THE DRAWINGS

FIGS. 2a–2i are schematic diagrams of the processing of a substrate according to the present invention;

DETAILED DESCRIPTION

Figure 1A:
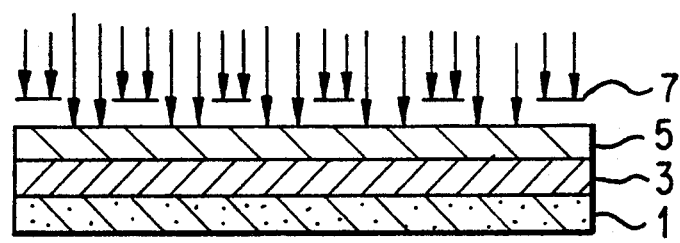
FIGS. 1a–c are schematic diagrams of a prior art method for the patterning of a tantalum layer.
Figure 1B:
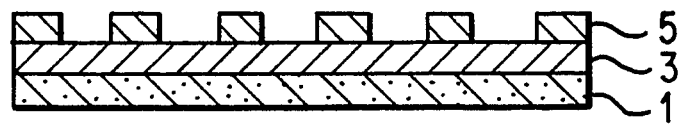
Figure 1C:
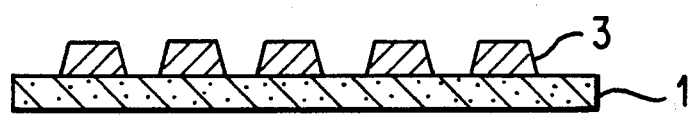
Figure 2A:
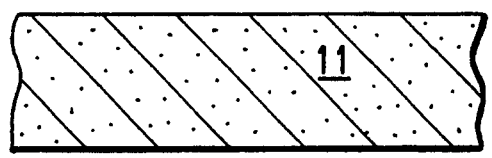

The present invention will be described with reference to the drawings. Patterned films have a variety of uses, one of which being the fabrication of bubble jet heater dies with an anti-cavitation layer, such as tantalum. Referring to FIG. 2a, a standard substrate 11 is shown, which is formed of silicon, or any of a variety of other substrate materials. In this embodiment, each bubble jet printhead comprises two halves: a first half comprising electronic circuitry (addressable heating elements, conductors, an anti-cavitation layer, etc.) and a second half comprising an ink reservoir and discrete channels. The reservoir and channels are formed using any of a variety of known methods such as orientation dependent etching. In this embodiment, approximately 198 of these first halves are to be formed on a four-inch diameter silicon wafer substrate.

Figure 2B:
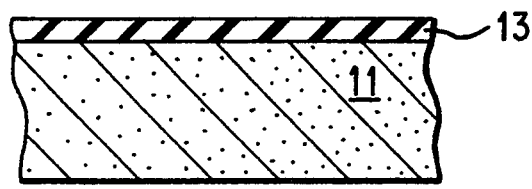
Figure 2C:
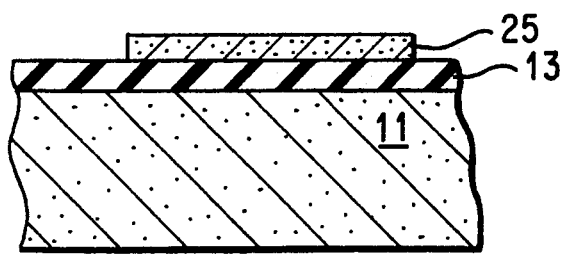
Figure 2D:
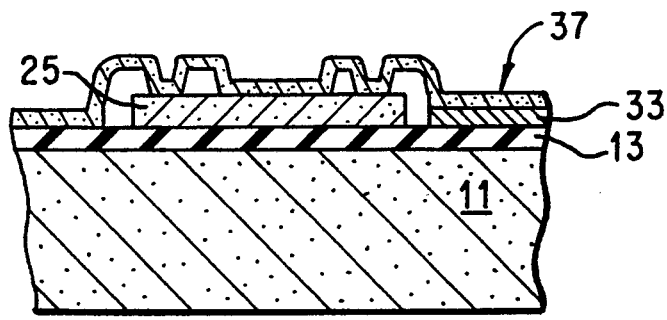

The substrate is coated with a 0.5 to 2.5 μm layer 13 of SiO$_2$ or other electrically and thermally insulating material, as shown in FIG. 2b. The substrate is then blanket coated with a 0.25 to 0.75 μm layer 25 of resistive material (such as polysilicon or nichrome, NiCr), doped to the proper resistance and patterned to form the resistor (i.e., heating element or heater), as shown in FIG. 2c. For a printhead having 300 dots per inch (dpi), approximately 128 heating elements appear in each thermal ink jet printhead with a spacing of approximately 84.5 μm between each one. As stated above, each heating element will rest within a channel appearing on the second half of the printhead. A channel has a typical width of 66 μm and a depth of 46 μm. A 0.25 to 1.0 μm thermally grown or deposited oxide layer 33 is formed and patterned to form conductor vias and open windows over each resistor region, followed by a high temperature reflow to round the edges of the vias and windows, as shown in FIG. 2d. A 0.15 to 1.0 μm silicon nitride layer 37 is then deposited over the entire substrate, also shown in FIG. 2d.

Figure 2E:
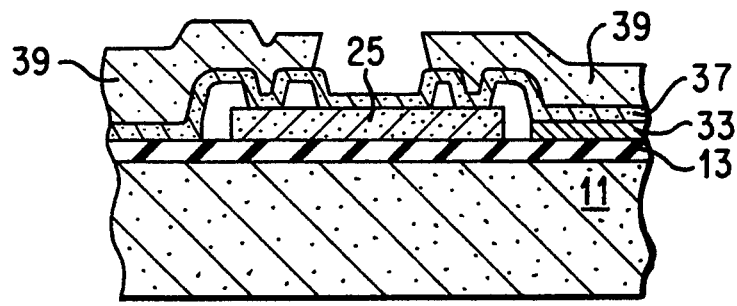
Figure 2F:
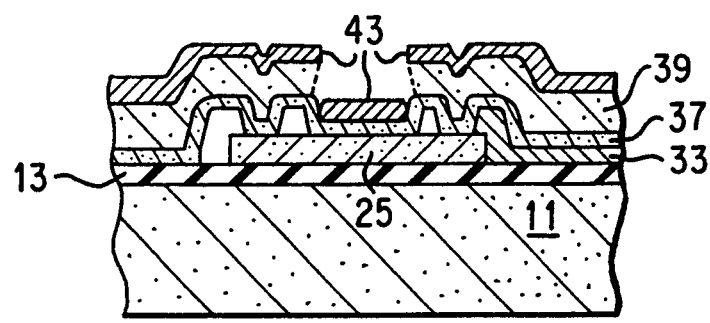
Figure 2E:
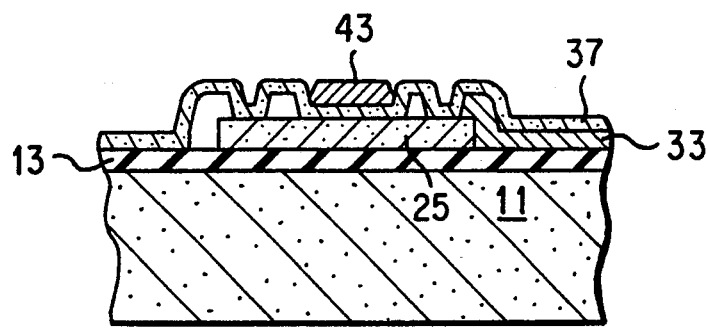

The anti-cavitation layer is then formed over these structures. The anti-cavitation layer can be formed of a variety of materials such as tantalum, titanium-tungsten alloy, and pure tungsten. Referring to FIG. 2e, a layer of modified positive photoresist 39 is formed on the substrate 11. The positive photoresist is a photoresist such as Shipley 1300-75, or AZ1375 which has been modified by adding 0.5% to 1% Monazoline C to the resist. Monazoline C is manufactured by Mona Ind., Inc. and is a 1-hydroxyethyl-2 alkylimidazoline having the following structural formula:

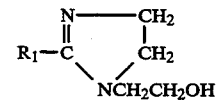

where R$_1$ is an alkyl radical with 7 to 17 carbon atoms. The resist is spin-coated onto the substrate in a known manner. A mask is placed in close proximity to the substrate 11. In this masking step, the positive photoresist layer 39 is exposed in certain areas to electromagnetic radiation, such as Ultra-Violet light. The substrate 11 is then baked at a temperature between 95° C. and 100° C. for approximately 10 minutes. During this baking step, the areas originally exposed to the Ultra-Violet light become insoluble to development and the areas originally protected from the Ultra-Violet light do not appreciably change. The entire substrate is then blanket exposed to Ultra-Violet light, thus making those areas originally protected from the Ultra-Violet light soluble to development. The entire substrate is then developed in a known manner. The resulting image, as shown in FIG. 2e, has inverted or reentrant side walls with a negative slope. As shown in FIG. 2f, a 0.25 to 1.0 μm thick tantalum layer 43 is then formed on the substrate 11 using a sputtering method which is well-known in the art. The substrate 11 is then immersed in a resist stripper with ultrasonic agitation to remove the patterned re-entrant photoresist layer 39 and any unwanted tantalum attached to this photoresist layer, as shown in FIG. 2g.

The resulting patterned tantalum layer 43 is shown in FIG. 2g. Since the developed photoresist layer 39 had reentrant walls, the tantalum structures have a trapezoidal appearance which is advantageous for the deposition of other layers on top of the tantalum layer 43 (i.e. the trapezoidal shape prevents gaps from forming between layers). Also, because the tantalum is deposited only in certain discrete areas, stress-cracking that is seen in the deposition and etch methods is avoided.

Figure 3A:
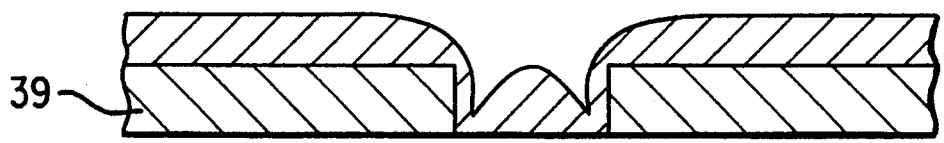
FIGS. 3a–3c are schematic diagrams of the processing of a substrate using varying types of photoresist.
Figure 3B:
Figure 3C:
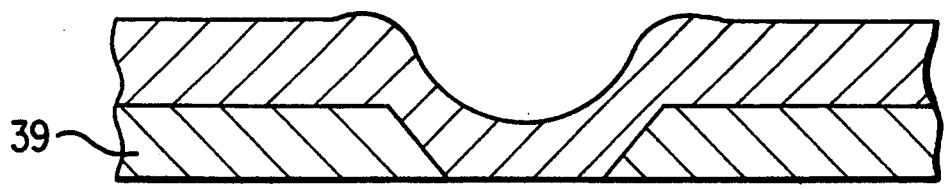

Referring to FIGS. 3a and 3b, if the walls in the developed photoresist layer 39 were appreciably vertical, then some of the tantalum that rests on these walls could remain attached to the anti-cavitation layer after the photoresist is removed. This excess tantalum could affect the deposition of other layers on top of the tantalum. Referring to FIG. 3c, if the walls in the developed photoresist layer 39 were positively sloped, then the tantalum deposited over the heating elements would be fully connected to the tantalum resting on the photoresist layer 39. Removal of just the tantalum on top of the photoresist by dissolving the photoresist is extremely difficult.

Figure 2H:
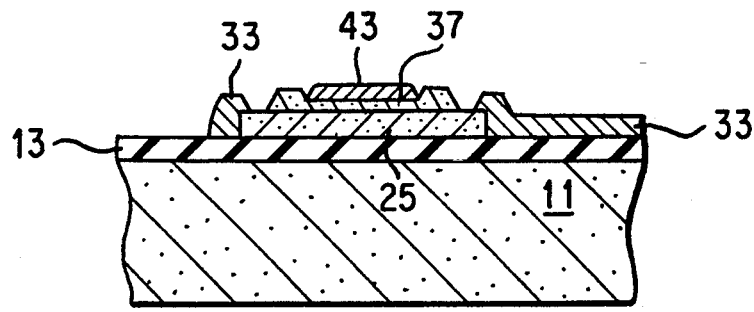

The tantalum layer 43 can now be used as a mask for the underlying silicon nitride layer 37, as shown in FIG. 2h. This method for depositing tantalum can also be used for other anti-cavitation materials and be performed on reactive substrates.

Figure 2I:
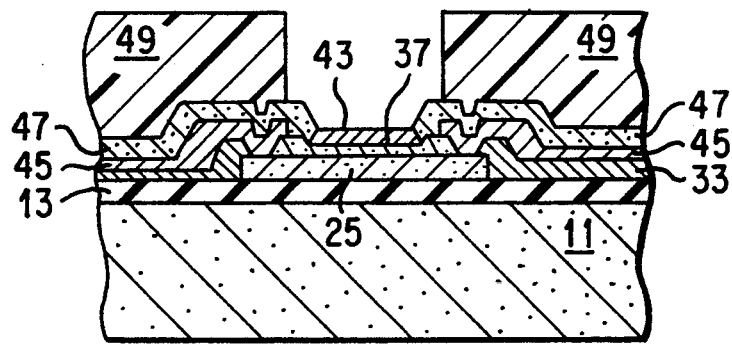

Referring to FIG. 2i, the deposition of aluminum, passivation, and polyimide layers is shown. The 0.5 to 2.0 $\mu$m aluminum layer 45 is sputtered onto the substrate 11 in a known manner. The aluminum layer 45 is then patterned by masking the layer and etching. The resulting patterned aluminum layer 45 serves as an electrical interface with the controlling circuit for the printhead, drivers, transistors, and timing gates, either fabricated on the substrate itself or as a separate entity. A passivation layer 47 (e.g., silicon dioxide, silicon nitride, polysilicon glass, and plasma nitride) of up to 1.25 $\mu$m is formed on top of the aluminum layer 45. Finally, a polyimide layer 49 is spin-coated onto the substrate to a thickness of 25 to 100 $\mu$m. This polyimide film has photosensitive properties and is exposed to Ultra-Violet light through a mask. The polyimide layer is developed, so as to expose the passivation and tantalum areas, as shown in FIG. 2i.

Figure 4A:
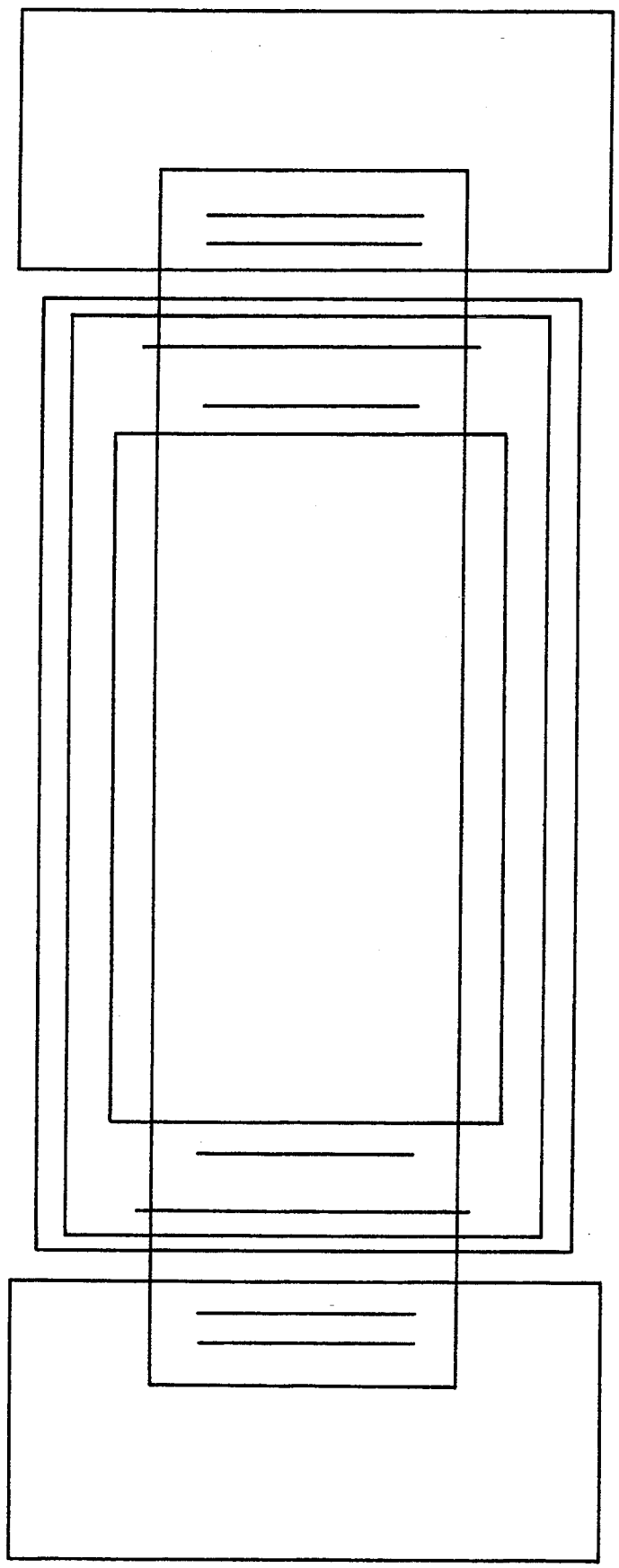
FIG. 4 is an additional schematic diagram of the multiple layers in a bubble jet printhead.
Figure 4B:
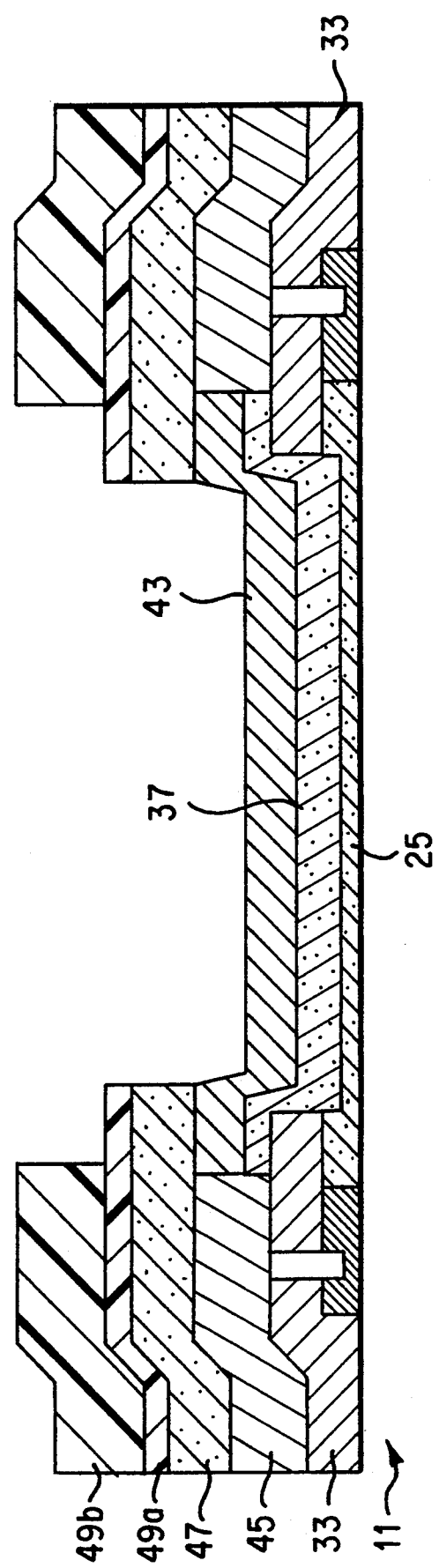

Referring to FIG. 4, an additional schematic cross-section of the electronic circuitry appearing on a first half of a thermal ink jet printhead is shown. All dimensions shown are simply examples of those dimensions in a typical printhead. All measurements are shown in micrometers unless otherwise indicated. The tantalum layer for a 300 dpi printhead has width of 71 $\mu$m ($\pm$approximately 10 $\mu$m) and a length of 144 $\mu$m. First and second polyimide layers 49a, 49b are present in this embodiment. The first polyimide layer 49a protects the underlying electronic circuit elements described above. The second polyimide layer 49b performs several functions. First, the second polyimide layer 49a creates a relatively large pit, in which the heater element is disposed. During operation of the printhead, an ink bubble is formed over the heater when it is activated causing ink to flow out of the channel. As the bubble collapses, it does so in this pit, thus preventing air ingestion into the channel. Also, the second polyimide layer 49a provides a second pit, which produces a passage for ink to travel from the reservoir to the individual channels.

Different dimensions are present in the components of the printhead depending on the number of dots per inch that can be printed by the printhead. The aforementioned printhead structure can be used for letter quality printers having 150 to 1200 dpi.

Figure 5:
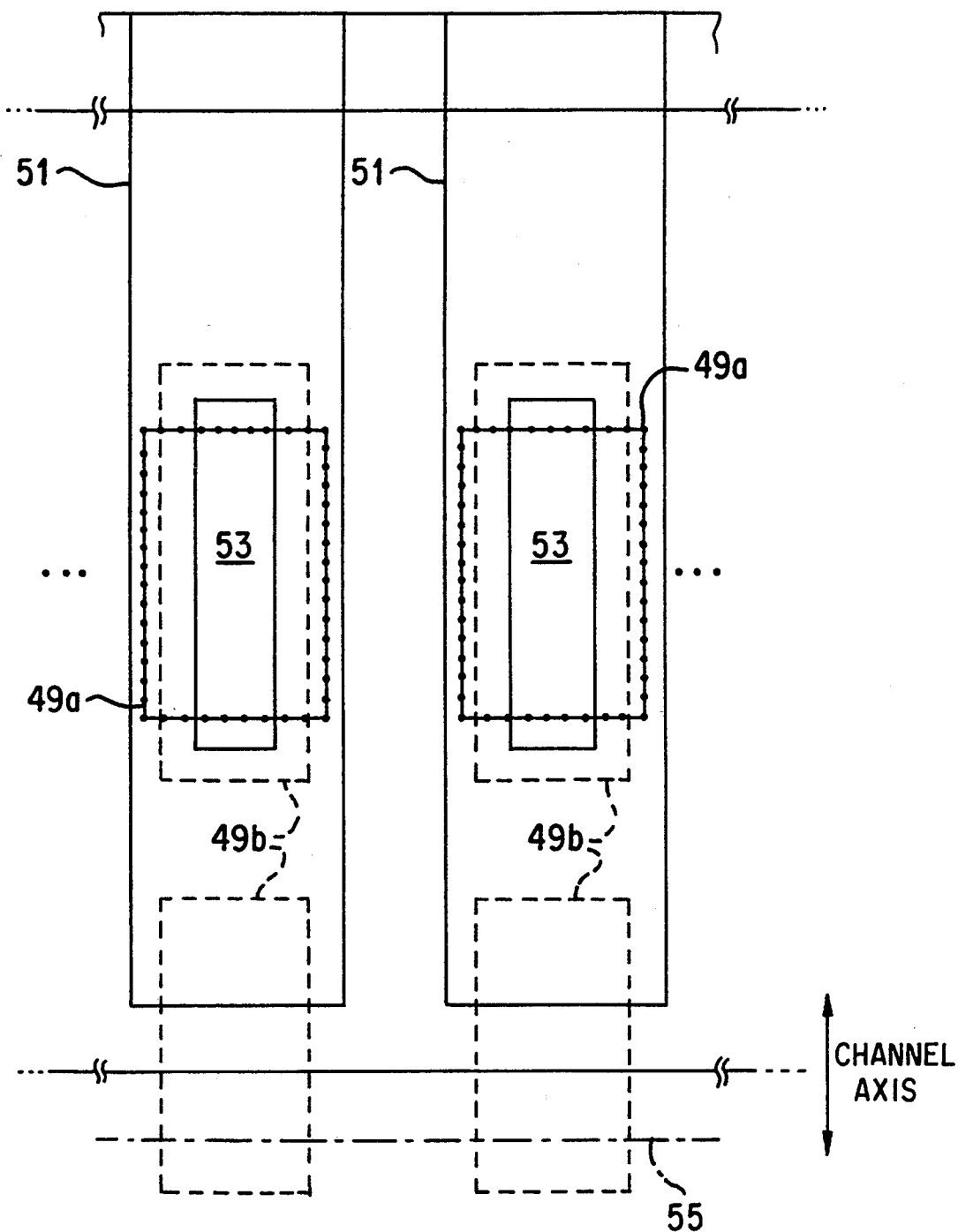
FIG. 5 is an overhead view of two of a plurality of channels in a bubble jet printhead.

Referring to FIG. 5, an overhead view of two of the plurality of channels in a bubble jet printhead is shown. All dimensions shown are in micrometers. As stated above, for a 300 dpi printhead, approximately 128 channels 51 are used. Each channel 51 has a width of 66 $\mu$m and a separation of 84.5 $\mu$m. The second pit in the second polyimide layer 49b provides a passage for ink to flow from a reservoir 55 into the channels 51. The contact areas 53 represent those areas visible to the channels 51 appearing between the deposited oxide layers 33. In this embodiment, the anti-cavitation layer 43 and heating element 25 for each channel 51 extend over a wider area than the contact area 53 to insure proper flow of ink through the channel 51 and the prevention of cavitation (collapsing ink vapor bubbles).

The above is a detailed description of particular embodiments of the invention. The full scope of the invention is set out in the claims that follow and their equivalents. Accordingly, the claims and specification should not be construed to unduly narrow the full scope of protection to which the invention is entitled.

What is claimed is:

1. A method of forming patterned anti-cavitation damage layers in isolated regions in a thermal ink jet print head in order to avoid stress cracking, said thermal ink jet print head comprising heaters, said method comprising:
   coating a heater on a substrate of said thermal ink jet print head with modified photoresist to form a photoresist layer;
   exposing said photoresist layer, said heater and said substrate with electromagnetic radiation through a mask, said mask comprising areas transparent and opaque to said electromagnetic radiation;
   baking said substrate, said heater and photoresist layer for a period of time;
   blanket exposing said substrate, said heater and photoresist layer for a period of time;
   developing said photoresist layer sufficiently to form patterned structures in said photoresist layer, said patterned structures having inverted side walls;
   depositing metal onto said heater and photoresist layer sufficiently to form a patterned anti-cavitation damage layer in isolated regions of said substrate such that stress cracking in said anti-cavitation damage layer is avoided; and
   removing said photoresist layer, such that said patterned anti-cavitation layer remains on said heater.

2. The method of claim 1, wherein in said coating step, said photoresist includes 0.5% to 1.0% of a 1-hydroxyethyl-2 alkylimidazoline.

3. The method of claim 2 wherein in said depositing step, said metal is tantalum.

4. The method of claim 2 wherein in said baking step, said period of time is approximately ten minutes.

5. The method of claim 2 wherein in said baking step, said substrate and patterned photoresist layer are heated to a temperature between 95° C. and 100° C.

6. The method of claim 2 wherein in said exposing step, said electromagnetic radiation is Ultra-Violet light.

7. A method of forming patterned anti-cavitation damage layers in isolated regions in a thermal ink jet print head in order to avoid stress cracking by physical forces that act upon a blanket coated layer, said thermal ink jet print head comprising heaters, said method comprising:
   providing a substrate of a thermal ink jet print head; said substrate having a plurality of heaters being equally spaced apart and having a density of between 150 and 1200 heater per inch;
   coating said plurality of heaters on said substrate of said thermal ink jet print head with modified photoresist to form a photoresist layer;
   exposing said photoresist layer, said heaters and said substrate with electromagnetic radiation through a mask, said mask comprising areas transparent and opaque to said electromagnetic radiation;

baking said substrate, said heaters and photoresist layer for a period of time;

blanket exposing said substrate, said heaters and photoresist layer for a period of time;

developing said photoresist layer sufficiently to form patterned structures in said photoresist layer, said patterned structures having inverted side walls;

depositing metal onto said heater and photoresist layer sufficiently to form a patterned anti-cavitation damage layer in isolated regions of said substrate over each of said heaters such that stress cracking in said anti-cavitation damage layer due to blanket coating said anti-cavitation damage layer over a relatively large area of said substrate is avoided; and removing said photoresist layer, such that said each patterned anti-cavitation layer remains on said heater.

8. The method of claim 7 wherein said heaters are placed on said substrate with a density of 300 heaters per inch, such that each anti-cavitation damage layer as a width between 61 and 81 μm.

9. The method of claim 8 wherein each anti-cavitation damage layer has a length of 144 μm.

10. The method of claim 9 wherein said providing step includes providing a substrate wherein each of said heaters are substantially identical in configuration, rectangularly shaped, and arranged in parallel fashion.

* * * * *